(12) United States Patent
Rakov (10) Patent No.: US 11,069,331 B2
(45) Date of Patent: Jul. 20, 2021

(54) NOISE REDUCTION FILTER FOR SIGNAL PROCESSING

(71) Applicant: PerkinElmer Health Sciences, Inc., Waltham, MA (US)

(72) Inventor: V. Sergey Rakov, Waltham, MA (US)

(73) Assignee: PerkinElmer Health Sciences, Inc., Waltham, MA (US)

( * ) Notice: Subject to any disclaimer, the term of this patent is extended or adjusted under 35 U.S.C. 154(b) by 231 days.

(21) Appl. No.: 16/275,978

(22) Filed: Feb. 14, 2019

(65) Prior Publication Data

US 2020/0160824 A1 May 21, 2020

Related U.S. Application Data

(60) Provisional application No. 62/769,174, filed on Nov. 19, 2018.

(51) Int. Cl.
*H03H 17/02* (2006.01)
*G10K 11/175* (2006.01)

(52) U.S. Cl.
CPC ....... *G10K 11/175* (2013.01); *H03H 17/0211* (2013.01); *H03H 17/0291* (2013.01)

(58) Field of Classification Search
CPC .......... H03H 17/0009; H03H 17/0211; H03H 17/0291; H03H 2017/0081; G06F 7/64; G06F 17/10; G10K 11/175

See application file for complete search history.

(56) References Cited

U.S. PATENT DOCUMENTS

| | | | | |
|---|---|---|---|---|
| 5,592,517 A | * | 1/1997 | Camp | G06F 17/10 375/350 |
| 8,891,711 B1 | * | 11/2014 | Whitehead | H03H 17/02 375/350 |
| 2004/0128113 A1 | * | 7/2004 | Gerrish | H03H 17/0283 702/190 |
| 2009/0083354 A1 | * | 3/2009 | Nene | H03H 17/0227 708/320 |
| 2015/0236670 A1 | * | 8/2015 | Pande | H03H 17/0671 708/307 |

* cited by examiner

*Primary Examiner* — Aimee Li
*Assistant Examiner* — Emily E Larocque
(74) *Attorney, Agent, or Firm* — Banner & Witcoff, Ltd.

(57) ABSTRACT

A noise reduction filter for data signals is implemented using two orthogonal coordinates comprising intensity and differential intensity values generated from sampling and sorting the data signals. A weighting function is used to amplify or reduce different portions of a data set distribution generated using the intensity and differential intensity values. The weighting function may also include scalar constants to further enhance the capability of the noise reduction filter. The noise reduction filter can be used to reduce the noise components or increase the useful signal components of a noisy data signal, thereby increasing the signal-to-noise ratio, and also increasing spectral resolution. The noise reduction filter can also be used in special cases where the intensity and frequency spectra of the noisy data signal are overlapping. The noise reduction filter may be used in various applications including spectroscopy and image processing, among others.

20 Claims, 9 Drawing Sheets

NOISE REDUCTION FILTER FOR SIGNAL PROCESSING

CROSS-REFERENCE TO RELATED APPLICATIONS

This application claims priority to U.S. Provisional Application No. 62/769,174, filed on Nov. 19, 2018, which is herein incorporated by reference in its entirety.

FIELD

Aspects described herein generally relate to signal processing. More specifically, aspects described herein provide an improved noise reduction filter to improve the signal-to-noise ratio of a noisy data signal, and potentially increase signal resolution.

BACKGROUND

Noise reduction in data signals is useful in various fields, e.g., spectroscopy, digital image processing, audio and speech processing, sonar, radar and other sensor array processing, spectral density estimation, statistical signal processing, control systems, biomedical engineering, and seismology, to name a few non-limiting examples. Noise reduction in data signals generally involves recovering a useful data signal from a noisy data signal using some sort of noise reduction filter.

In general, noisy data signals can be characterized by their intensity and frequency spectral components, which can be classified into components representing the useful data signal and components representing the unwanted noise. The ratio of the intensity of the useful data signal to the intensity of the unwanted noise is called the signal-to-noise-ratio (SNR). Noise reduction filters improve the SNR of a noisy data signal.

The intensity and frequency spectral components of the noisy data signal can take on many forms. In cases where the intensity spectrum of the useful data signal is significantly greater than the intensity spectrum of the unwanted noise, the noise reduction filter can be implemented using a simple thresholding of the data signal to improve the SNR of the noisy data signal. In cases where the frequency of the unwanted noise is significantly greater or lower than the frequency of the useful data signal, the noise reduction filter can be implemented using a simple low-pass or high-pass filter, respectively, to improve the SNR of the noisy data signal.

However, there exists no suitable noise reduction filter to improve the SNR of the noisy data signal without significant signal distortion in situations where the intensity and frequency spectra of the useful data signal and unwanted noise may be overlapping.

SUMMARY

The following presents a simplified summary of various aspects described herein. This summary is not an extensive overview, and is not intended to identify key or critical elements or to delineate the scope of the claims. The following summary merely presents some concepts in a simplified form as an introductory prelude to the more detailed description provided below.

To overcome limitations in the prior art described above, and to overcome other limitations that will be apparent upon reading and understanding the present specification, aspects described herein are directed to noise reduction in and for signal processing.

According to various aspects of the disclosure, a data signal may be received using a receiver. The data signal may include a noise component and a signal component. A first data set can be generated based on the received data signal. The first data set may comprise of ordered pairs of intensity and differential intensity values of the data signal. The first data set can be sorted based on the intensity and differential intensity values. A weighted multiplication function can be applied to the sorted first data set. The weighted and sorted first data set can be rearranged and re-sorted to correspond to an original order of ordered pairs in the first data set. The intensity values can be added to their corresponding differential intensity values in the rearranged data set to generate a second data set. An output data set can be generated by inserting a first intensity value of the first data set into a first position of the second data set.

According to another aspect of the disclosure, a computer with one or more processors and memory can be used to receive a data using a receiver. The data signal may include a noise component and a signal component. The computer may also generate a first data set based on the received data signal. The first data set may comprise of ordered pairs of intensity and differential intensity values of the data signal. The first data set can be sorted by the computer based on the intensity and differential intensity values. The computer processor may apply a weighted multiplication function to the sorted first data set. The computer processor may rearrange the weighted and sorted first data set to correspond to an original order of ordered pairs in the first data set. The computer processor may perform the instructions of adding the intensity values to their corresponding differential intensity values in the rearranged data set to generate a second data set. The computer processor may generate an output data set by inserting a first intensity value of the first data set into a first position of the second data set.

DESCRIPTION OF THE DRAWINGS

Some features are shown by way of example, and not by limitation in the accompanying drawings. In the drawings, like numerals reference similar elements.

DETAILED DESCRIPTION

Noise reduction filters that suppress noise components of a noisy data signal thereby increasing the signal-to-noise ratio (SNR) of the data signal are described. Noise reduction filters may, in some embodiments, use two orthogonal coordinates corresponding to intensity and differential intensity values of the noisy data signal, and also second, third, and higher (up to fifth) differential of intensity. Additionally, noise reduction filters may also include various weighting functions that can be adjusted to provide the desired filter output response. The noise reduction filter can be used to suppress the contribution of noise in data signals with overlapping intensity and frequency spectral characteristics. However, the noise reduction filter is flexible and can also be used in situations where the intensity and frequency spectral characteristics of the data signal are not overlapping. The noise reduction filter has been tested using hypothetical and real-world noisy data signals to illustrate its validity as a spectral processing tool and a potentially valuable addition to any spectral processing software toolbox used in various applications including spectroscopy and image processing.

Figure 1:
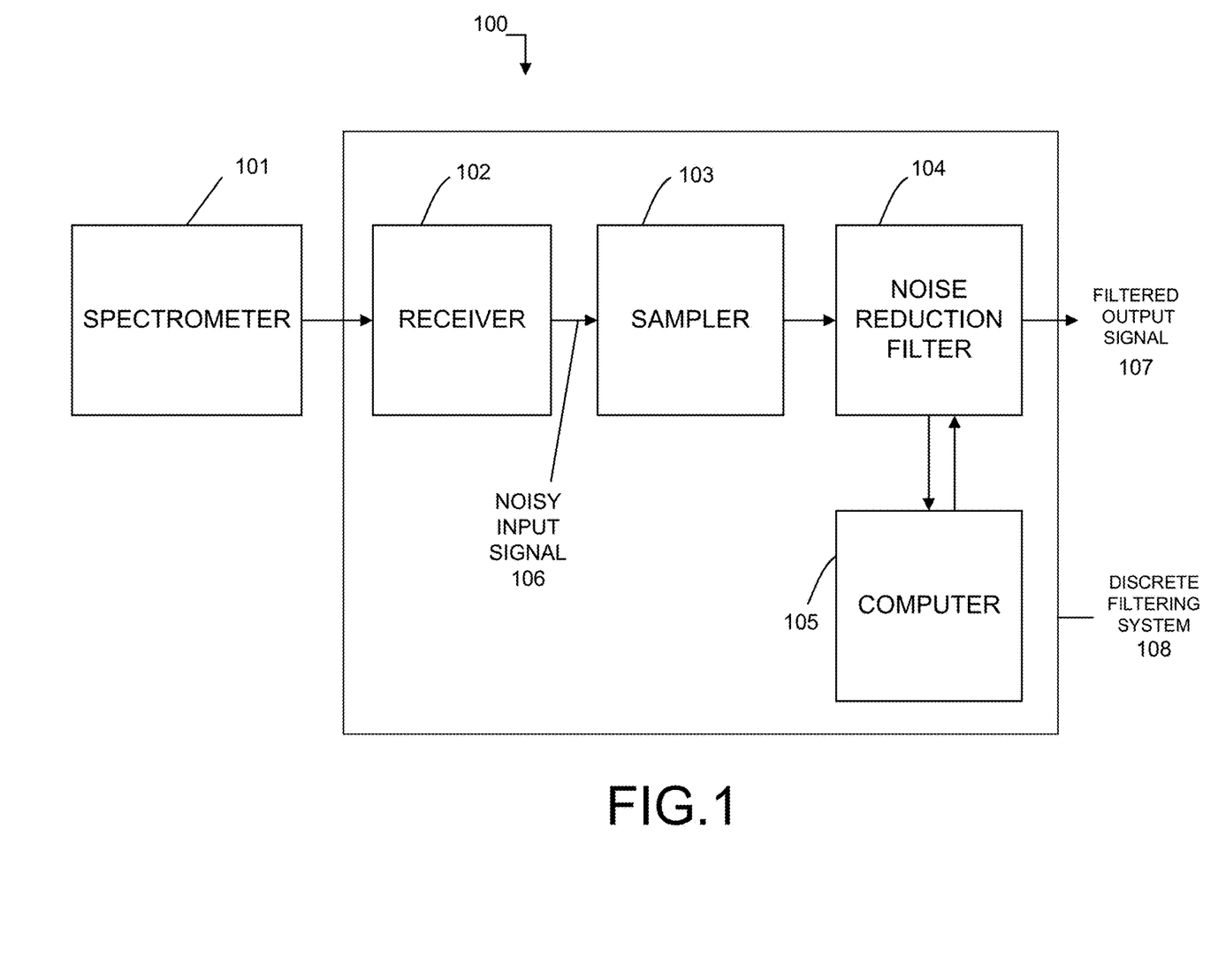
FIG. 1 is a block diagram depicting a signal processing system according to illustrative aspects described herein.

Referring now to the drawings, FIG. 1 is a block diagram of a signal processing system 100 that comprises a spectral processing component 101 (e.g., a spectrometer) and a discrete filtering system 108. The spectrometer 101 outputs a noisy data signal, e.g., noisy input signal 106. The noisy input signal includes a useful data signal component and an unwanted noise signal component. While FIG. 1 illustrates the signal processing component 101 as a spectrometer, it would be understood that any appropriate signal processing component, for example, an image processor, camera, radio receiver, or any instrument that may generate noisy data signals and benefit from filtering as described herein.

The discrete filtering system 108 is used to perform the operations of sampling and filtering the output of the spectrometer 101 to generate a filtered output signal 107. The discrete filtering system 108 uses a noise reduction filter 104 to reduce the noise signal components of a noisy data signal and generate a filtered output signal 107. The filtered output signal 107 has a greater signal-to-noise ratio than the noisy input signal 106. As shown in FIG. 1, the discrete filtering system 108 may also include a receiver 102 configured to receive the noisy data signal 106 and convert it to a continuous time- or space-varying signal that can be characterized using its intensity and frequency spectrum. A sampler 103 can be configured to receive the output from the receiver 102 and converts the continuous noisy signal into a discrete data signal by sampling the signal. According to some embodiments, the sampler 103 may use a sampling frequency or frequency spacing to generate the discrete data signal with N sample data points.

The discrete filtering system 108 may also include a computer 105 configured to communicate with the noise reduction filter 104. According to various embodiments, the computer 105 may be configured to process and store information used during the implementation of the noise reduction filter 104. An example computer is described below with respect to FIG. 2.

Figure 2:
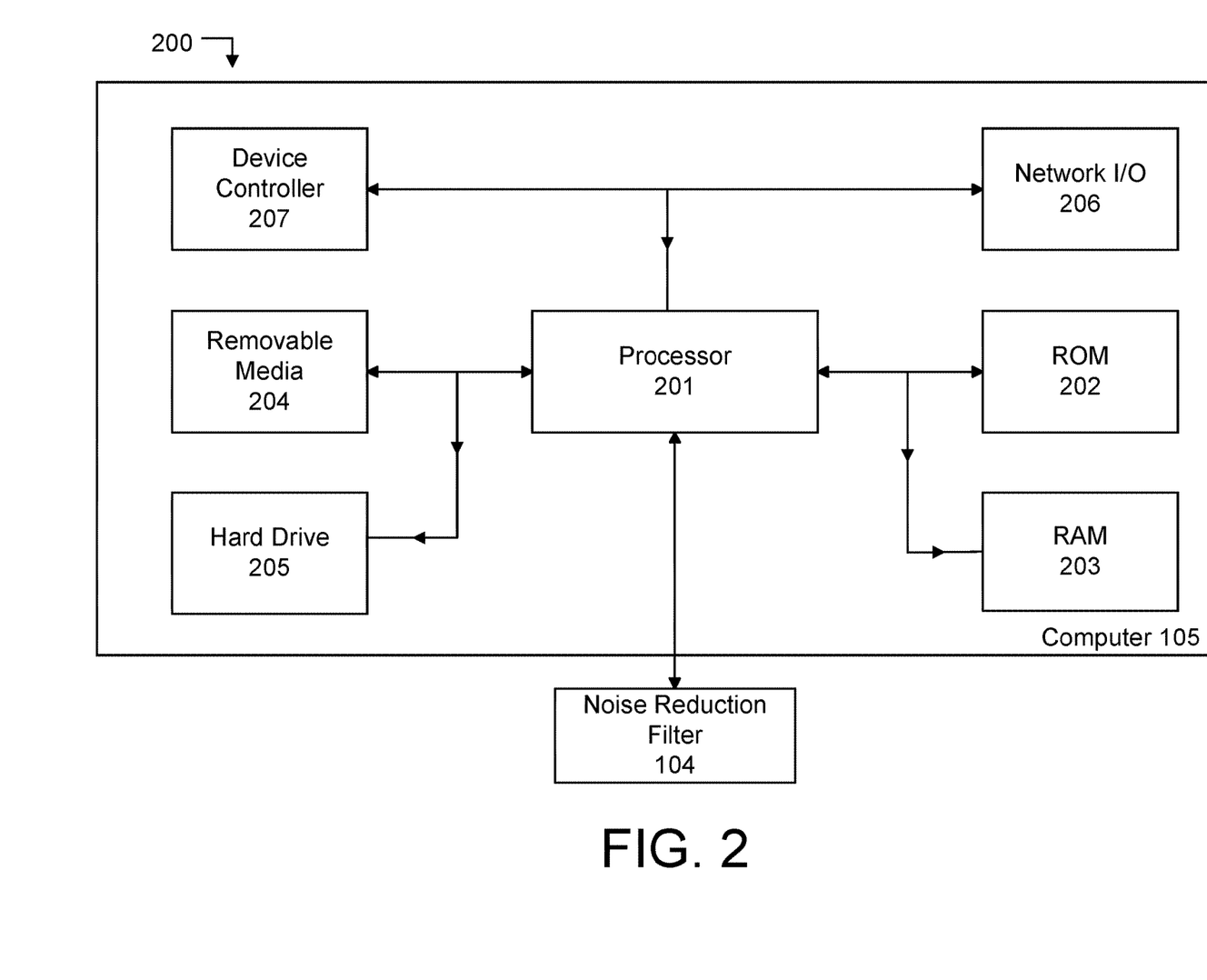
FIG. 2 is a block diagram depicting an example computing device that can be used to implement various aspects of the disclosure.

FIG. 2 is a block diagram depicting an example of a computing device 200. According to some embodiments computing device 200 could be used to implement one or more components of system 100. For example, computing device 200 could be used to implement one or more of the receiver 102, sampler 103, noise reduction, and computer 105 components depicted in FIG. 1. The computer 105 may be configured to execute the instructions used in the implementation of the noise reduction filter 104. As shown in FIG. 2, computer 105 includes a processor 201, a memory comprising a read only memory, ROM 202, and a random-access memory, RAM 203. The computer 104 also includes a storage device comprising a hard drive 205 and removable media 204. Further, the computer 105 also has a device controller 207 and a network input/output (network I/O) interface 206. Each of the processor 201, ROM 202, RAM 203, hard drive 205, removable media 204, device controller 207, and network I/O 206, are interconnected using various buses, and may be mounted on a common motherboard or in other manners as appropriate.

The processor 201 can process instructions from the noise reduction filter 104 for execution within the computer 105, including instructions stored in ROM 202 and RAM 203 or in the hard drive 205 and removable media 204. In other implementations, multiple processors and/or multiple buses may be used, as appropriate, along with multiple memories. Also, multiple computers may be connected, with each device providing portions of the necessary operations, to form a multi-processor system.

The memory which comprises ROM 202 and RAM 203 stores information within the computer 105. In some implementations the memory is a volatile memory. In other implementations, the memory is a non-volatile memory. The memory may also be another form of computer-readable medium, such as a magnetic or optical disk.

The storage which comprises the hard drive 205 and the removable media 204 can provide mass storage for the computer 105. The removable media may contain a computer readable medium, such as a floppy disk device, a hard disk device, an optical disk device, a tape device, a flash memory or other similar solid-state memory device, or an array of devices, including devices in a storage area network or other configurations.

The instructions used in the noise reduction filter can be stored in an information carrier. The instructions when executed by one or more processing devices (for example, processor 201), perform the method as described above. The instructions can also be stored by one or more storage devices such as ROM 202, RAM 202, hard drive 205, or removable media 204.

The device controller 207 is a part of a computer 105 that controls the signals going to and coming from the processor 201. The device controller 207 uses binary and digital codes. The device controller 207 has a local buffer and a command register and communicates with the processor 201 by interrupts. The network I/O 206 is used to allow the computer 105 to access information on a remote computer or server. The device controller 207 functions as a bridge between devices connected to the computer 105, such as the network I/O 206 interface and the processor 201.

Figure 3:
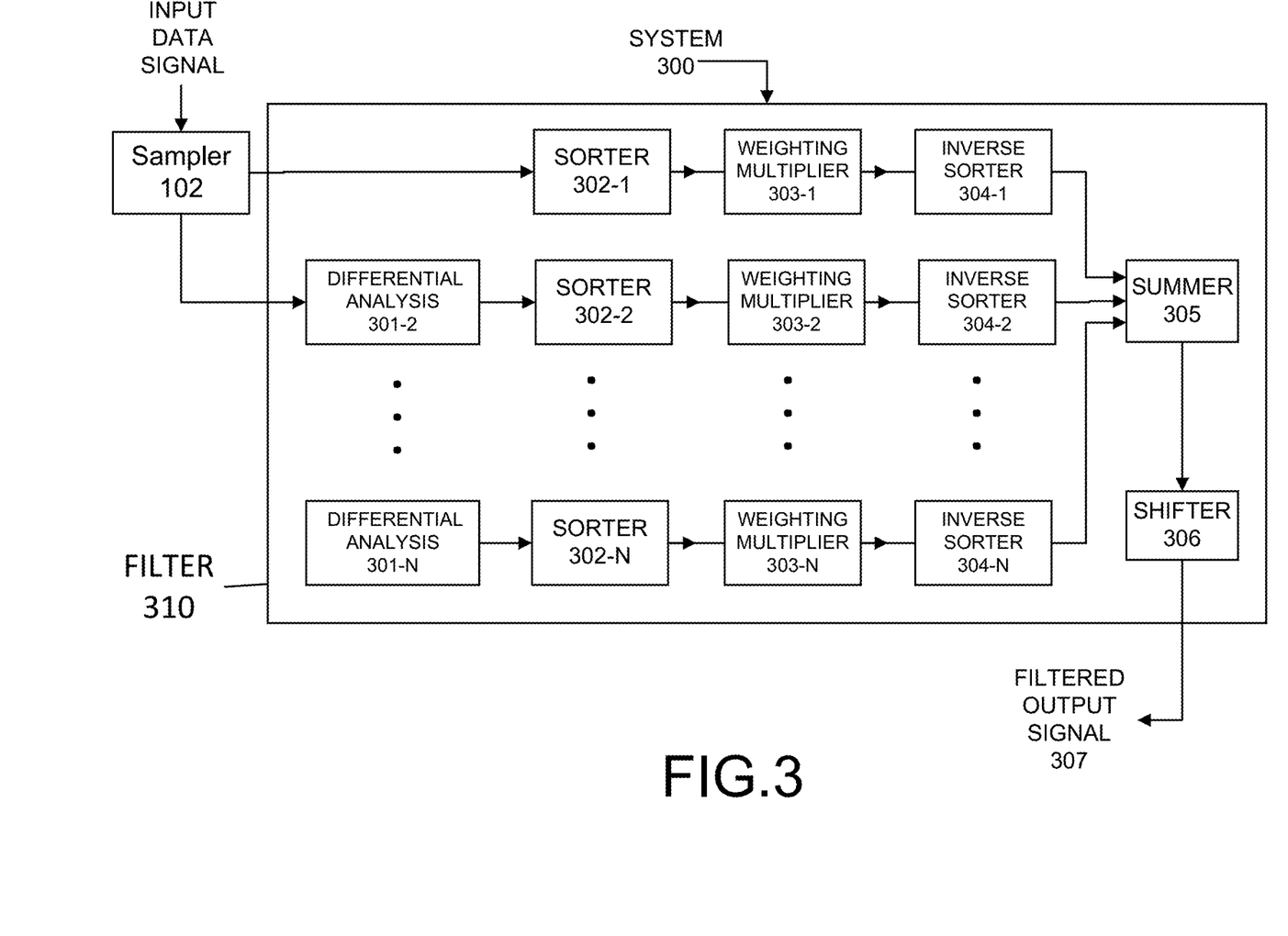
FIG. 3 is a functional block diagram showing the composition of an illustrative noise reduction filter and how an illustrative noise reduction filter may suppress noise in a sampled data signal.

As previously noted, the instructions used to perform the filtering functionality of the noise reduction filter 104 can be executed by the processor in the computer. FIG. 3 is a functional block diagram that can be used to implement the filtering functionality according to various embodiments. The system 300 may include a filtering component 310. According to various embodiments, filtering component 310 may be used to implement, for example, the noise reduction filter 104 depicted in FIG. 1. As shown in FIG. 3, the filtering component 310 may include differential analysis components of increasingly higher orders (e.g., second order component 301-2 to Nth order component 301-N), with respective amplitude sorter components (e.g., 302-1 to 302-N), principally different weighting multipliers (e.g., 303-1 to 303-N), respective inverse sorting components (e.g., 304-1 to 304-N), a summation component 305, and a shifting component 306. While not shown, it should be understood that the filtering functionality described herein could be realized in combination with other known filters and/or smoothing routines. Higher order differentials can be added to the algorithm without changing its principle depicted in FIG. 3. For example, higher order differentials can be generated by applying multiple differential analysis components 301 in succession and/or cascade, as shown explicitly for the first and second order differentials.

As discussed above, sampler 102 can be used to sample an input data signal to generate a set of intensity values $\{Y\}$ of the input data signal. The intensity data set $\{Y\}$ may comprise N−1 sample data points is obtained from the discrete noisy data signal such that $\{Y\}=\{y1, y2, \ldots, yN-1\}$. Differential analysis component 301-2 may be used to generate a set of differential values $\{dY\}$ of the difference between adjacent elements in the set of intensity values. For example, differential intensity data set $\{dY\}$ with N−1 sample data points can be obtained, using differential analysis component 301-2. The set $\{dY\}$ may comprise the difference between the nth intensity value and n−1th intensity value, of the discrete noisy data signal such that $\{dY\}=\{y2-y1, y3-y2, yN-yN-1\}$. The two sets $\{Y\}$ and $\{dY\}$ may be referred to as orthogonal or canonical sets herein.

As shown in FIG. 3, the system 300 may also comprise sorters 302-1 and 302-2 that are used to sort the two sets $\{Y\}$ and $\{dY\}$. In some embodiments, the sorters 302-1 and 302-2 may be used to sort the two sets $\{Y\}$ and $\{dY\}$ in increasing order to form two new sets $\{Z\}$ and $\{dZ\}$. Both of $\{Z\}$ and $\{dZ\}$ would then have N−1 sample data points.

Weighting multipliers 303-1 and 303-2 can be configured to apply a weighting value to sets $\{Z\}$ and $\{dZ\}$ by multiplying similar or different weighting functions (WF and WdF) by sets $\{Z\}$ and $\{dZ\}$ respectively forming weighted sorted sets $\{S\}$ and $\{dS\}$, both having N−1 sample data points. Accordingly, $\{S\}=WF*\{Z\}$ and $\{dS\}=WdF*\{dZ\}$. Next, the respective inverse sorters 304-1 and 304-2 are applied to sets $\{S\}$ and $\{dS\}$. The inverse sorters are configured to rearrange the sample data points in sets $\{S\}$ and $\{dS\}$ to match the same order as the sample data points in sets $\{Y\}$ and $\{dY\}$ generating new sets $\{YF\}$ and $\{dYF\}$.

A summer 305 computes the addition of intensity values in set $\{YF\}$ to their corresponding differential intensity values in $\{dYF\}$ generating data set $\{Ynew2\}$. Accordingly, $\{Ynew2\}=\{YF\}+\{dYF\}$. In the summer 305 operation described above, each Nth intensity of $\{YF\}$ is summed with its corresponding differential intensity value $\{dYF\}$. A shifter 306 is used to increase the length or number of sample data points in $\{Ynew2\}$ by one-unit step and the first intensity value of the original set $\{Y\}$ is inserted as the first intensity value of the shifted $\{Ynew2\}$ data set, generating a filtered output data set $\{Yfiltered\}$ having N sample data points.

The weighting functions WF and WdF used in the weighting multipliers 303-1,2 can play an important role in the noise reduction filter. The selection of the analytical forms and parameters used in weighting functions WF and WdF used can affect the successful application of the noise reduction filter to a specific application. In the forthcoming examples showing the application of the noise reduction filter to various noisy data signals, the intensity weighting function WF is a Gaussian function with its apex at the highest intensity value in data set used. Accordingly, strong intensities are assumed to be more valuable and are to be preserved. Further, the differential intensity weighting function WdF used in the previously mentioned examples, has two parts—a positive and a negative segment. This is because the differential intensity values $\{dY\}$ are a combination of both positive and negative intensity regions. As a result, in general, each region may need to be weighted differently.

Both parts of WdF in the examples are Gaussian, but not symmetric, and in one case low differential intensities were preserved, while in the other two examples they were suppressed. Alternatively, the noise reduction filter 103 can use any other weighting functions including but not restricted to: a first- or higher order polynomial function, a sudden-death or step function, a one- or two-sided Hanning or Hamming function, or any kind of sigmoid function. In general, the selection of a weighting function depends on the desired mode of noise suppression or enhancement to regions of intensity and differential intensity values.

According to some embodiments, the choice of parameters for weighting functions may be automatically determined from the intensity distributions of data sets $\{Z\}$ and $\{dZ\}$. This weighting function selection is based on the desire to preserve certain regions of the intensity spectrum. For example, the width of a one-sided Gaussian intensity weighting function WF can be calculated to preserve 75% of the cumulative intensity values. Also, the differential intensity weighting function WdF can be chosen as a two-sided step-function, setting 20% of lowest differential intensity values to zero. All these adjustments and further enhancements to the construction of the weighting functions are well within the scope of this novel noise reduction filter.

The filtering functionality describes above, may also include weighting by any combination of weighting functions (e.g., one or more of Gaussian, linear, quadratic, Hamming, etc.) Additionally, it is possible to apply the weighting functions to higher order difference values. For example, the differential intensity data set $\{dY\}$ described above, could be considered a first order data set. However, it would also be possible to apply similar techniques to higher order difference sets. For instance, a second order intensity data function $\{ddY\}$ could be generated by applying the differential analysis 301 to the differential intensity data set $\{dY\}$. Similar higher order data sets could be generated by applying the differential analysis 301 in succession. Indeed, any combination of such functions may be used to realize "high" order canonical amplitude filter (e.g., 3D, 4D, 5D, etc.). Additionally, it should be understood that it would be possible to realize a multi-stage canonical 2D (or higher order) filter with multiple filtering stages in series with each other. It should also be understood that the filters described herein (e.g., the 2D, 3D, 4D, 5D, etc. canonical filters) may be used in combination with other known filters and smoothing routines according to various embodiments.

Figure 4:
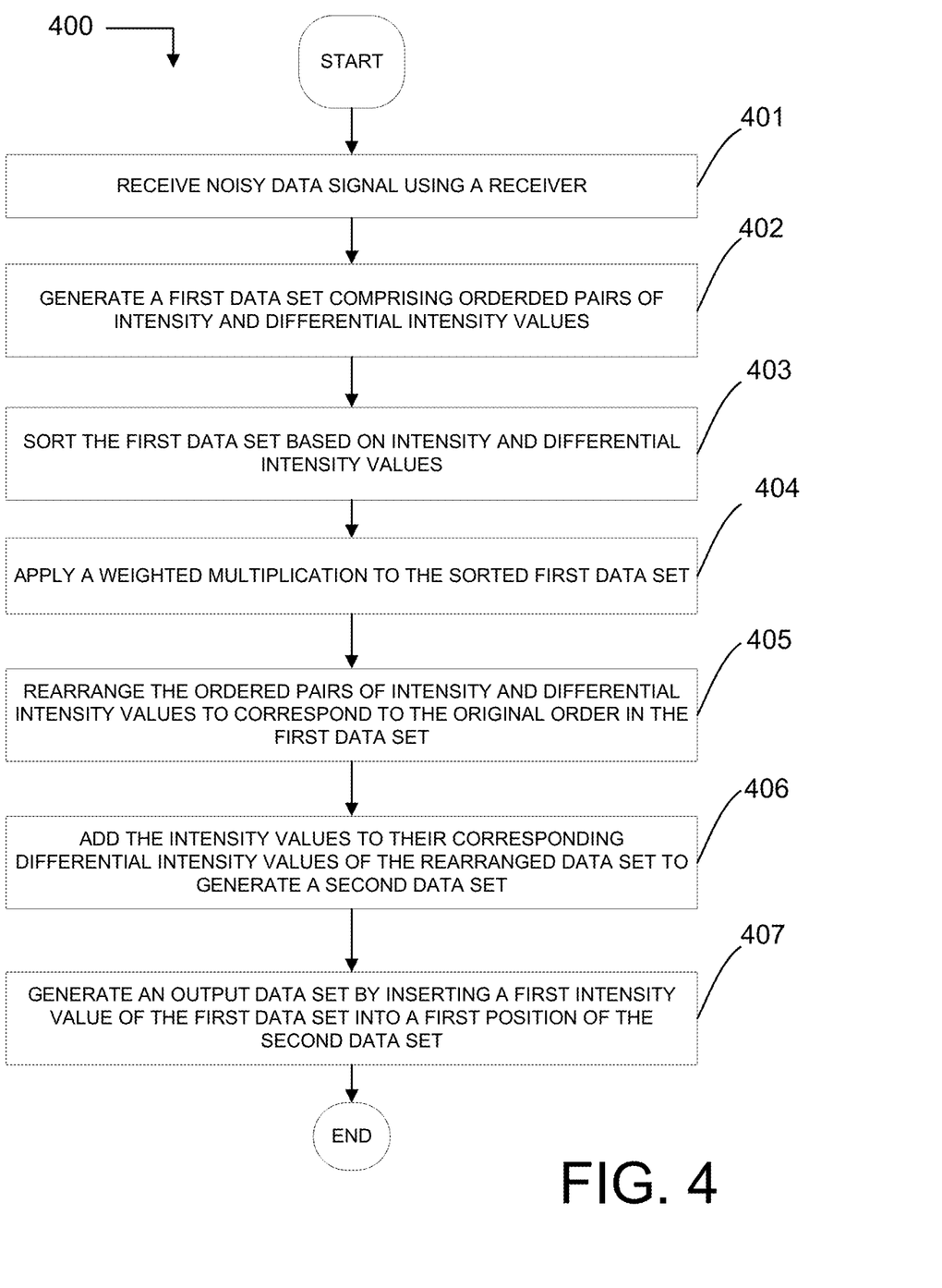
FIG. 4 is a flow diagram depicting a method for implementing the noise reduction filter according to illustrative aspects described herein.

FIG. 4 is a flow diagram showing a method 400 for implementing the functionality of noise reduction filters according to various embodiments. For ease of explanation and clarity, FIG. 4 will be described with reference to FIGS. 1-3. However, it should be understood that method 400 is not so limited as to require the particular architectures shown in those figures.

As shown, method 400 begins at 401 when a noisy data signal is received from a source (e.g., spectrometer 101)

using a receiver (e.g., receiver 102). At 402, a first data set can be generated. According to various embodiments, the first data set may be generated by sampling a received input signal (e.g., from receiver 102) using a sampling mechanism (e.g., sampler 103) to generate a set of intensity values. A set of differential values can be generated by determining the difference between adjacent intensity values. The first data set may comprise ordered pairs of intensity and differential intensity values.

At 403, the first data set may be sorted (e.g., using sorter 302). For example, in some embodiments, the first data set may be sorted based on intensity and differential intensity values. Once the first data set is sorted, weighted multiplication functions WF and WdF can be applied to the intensity and differential intensity values of the sorted data set.

At 405, the inverse sorters 304-1 and 304-2 may be configured to rearrange intensity and differential intensity values so that they correspond to an original order in the first data set. At 406, the rearranged intensity and differential intensity values can be added together to generate a second data set. According to some embodiments, the intensity values and differential intensity values can be added together using, e.g., summer 305. After the second data set is generated, an output set can be generated at 407. The output set can be generated by shifting the data set one or more positions and inserting one or more original values into the shifted portions of the data set so that the final output set has the proper dimensions.

Figure 5:
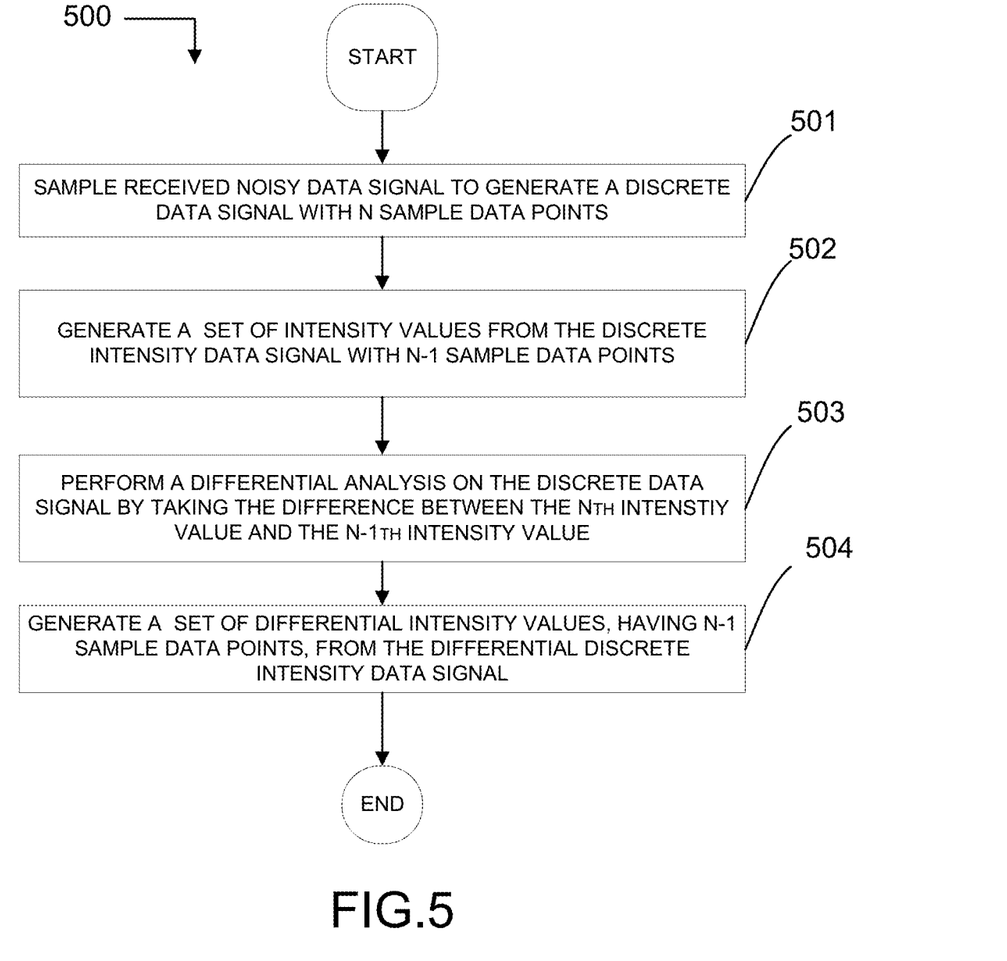
FIG. 5 is a flow diagram depicting a method of generating a differential intensity data set according to illustrative aspects described herein.

FIG. 5 is a flow diagram depicting a method 500 of generating a data set that comprises ordered pairs of intensity and differential intensity values according to various embodiments. For example, in some embodiments, method 500 could be used to implement 402 of method 400 shown in FIG. 4. For ease of explanation and clarity, FIG. 5 will be described with reference to FIGS. 1-4. However, it should be understood that method 500 is not so limited so as to require the particular architectures shown in those figures.

As shown in FIG. 5, method 500 begins at 501 where a received noisy data signal is sampled to generate a discrete data signal with N sample data points by, for example, sampler 102. At 502, a set of intensity values (e.g., {Y} discussed above) can be generated from the discrete intensity data signal, where the set of intensity values has N−1 sample data points.

At 503, differential analysis can be performed on the discrete data by taking the difference between the Nth intensity value and the N−1th intensity value. At 504, the results of the differential analysis can be used to generate a set of differential intensity values {dY} having N−1 sample data points. In some embodiments, {dY}={y2-y1, y3-y2, yN-yN−1}.

Figure 6:
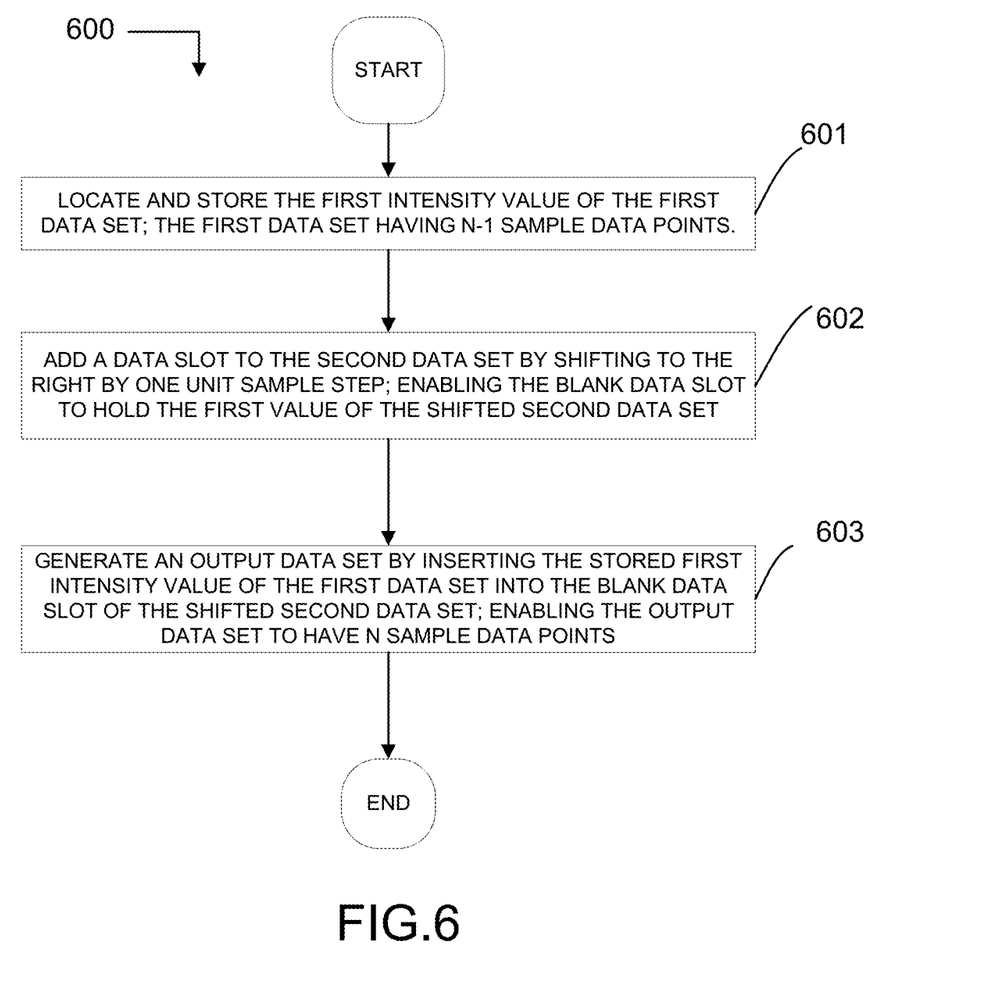
FIG. 6 is a flow diagram depicting a method of inserting a first intensity value of a first data set into a first position of a second data set according to illustrative aspects described herein.

FIG. 6 is a flow diagram depicting a method 600 that can insert a first intensity value of the first data set into a first position of the second data set according to various embodiments. For example, method 600 could be used to perform 407, shown in FIG. 4. For ease of explanation and clarity, FIG. 6 will be described with reference to FIGS. 1-5. However, it should be understood that method 500 is not so limited so as to require the particular architectures shown in those figures.

As shown in FIG. 6, method 600 begins at 601 by locating and storing the first intensity value of the first data set {Y}; the first data set having N−1 data points. At 602, an empty data slot may be added to the data set by shifting it to the right by one-unit sample step. The empty data slot may be used to hold a first value of the shifted second data set. At 603, an output data set is generated by inserting the stored first intensity value of the first data set into the blank data slot of the shifted second data set, enabling the first intensity data point of the first data set to occupy the first position of the output data set, and also enabling the output data set to have N sample data.

Figure 7A:
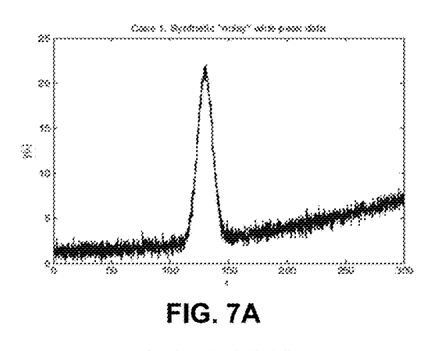
FIGS. 7A-7H are graphs depicting an example signals according to various illustrative aspects of the disclosure.
Figure 7B:
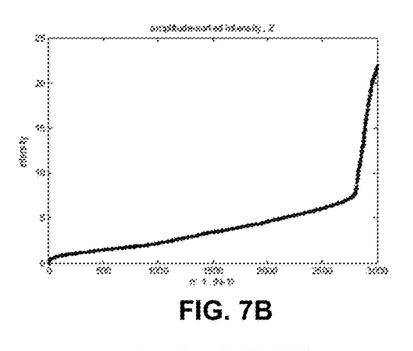
Figure 7C:
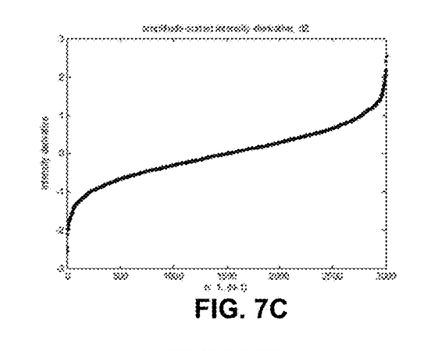

FIGS. 7A-H show the graphical results obtained when the noise reduction filter was applied to a simple hypothetical noisy data signal. This example is shown to illustrate basic features of the noise reduction filter by highlighting the step-wise description of the algorithmic steps. Specifically, FIG. 7A is a graph, denoted as y(x), showing a noisy data signal. The noisy data signal y(x) consists of a Gaussian peak on top of a baseline, constructed from a second-order curve, with random noise. FIGS. 7B and 7C are graphs showing the intensity and differential intensity sorted sets, {Z} and {dZ}, respectively. The high degree of linearity of the central region of the intensity sorted graph in FIG. 7B and the high degree of symmetry in the differential intensity sorted graph in FIG. 7C are due to synthetic random noise added to data signals. It should be noted that the low absolute differential intensities are due to noise and need to be suppressed. Therefore, only the upper third of the sorted intensity graph is attributed to being useful in the noise reduction filter.

Figure 7D:
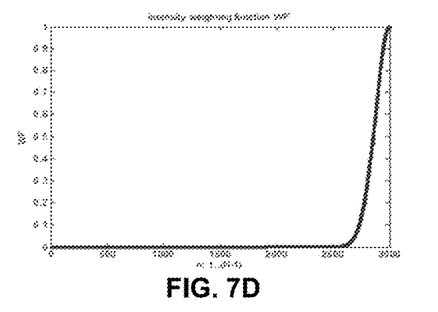
Figure 7E:
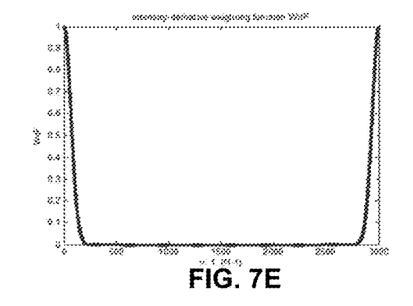
Figure 7F:
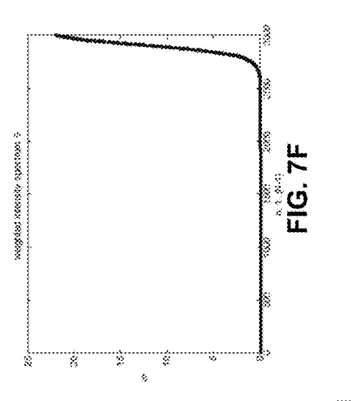
Figure 7G:
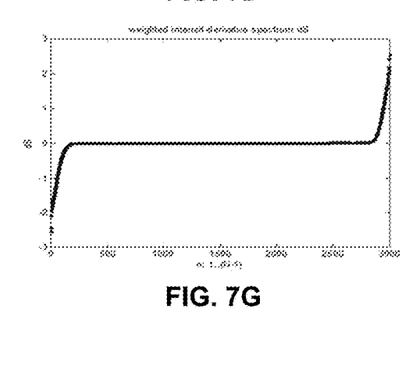

FIGS. 7D and 7E show the weighting functions WF and WdF, using Gaussian curves, applied to the sorted intensity and differential intensity data sets {Z} and {dZ} shown in FIGS. 7B and 7C. After multiplication of {Z} and {dZ} by respective weighting functions WF and WdF, weighted intensity and differential intensity data sets {S} and {dS} are generated as shown in FIGS. 7F and 7G, respectively. Comparing FIGS. 7F and 7G to FIGS. 7B and 7C, it should be noted that the central region of weighted intensity plot in FIG. 7F is now lowered close to zero and the central region of differential intensity plot in FIG. 7G is now flattened.

Figure 7H:
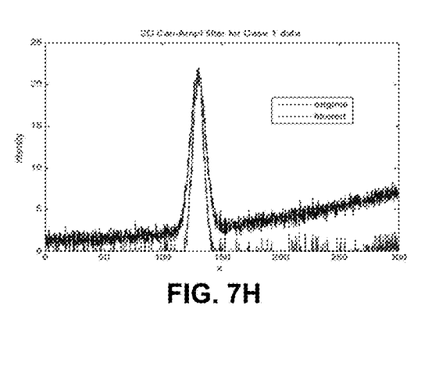

After rearranging the data points in {S} and {dS} and restoring them back to the original order of sets {Y} and {dY}, the intensity data values are added to their corresponding differential intensity values. Next, the first intensity data point of {Y} is added as a first value in the rearranged data set generating the final filtered output data set {Yfiltered}. The filtered output data set {Yfiltered} and the noisy data signal are shown in FIG. 7H. It should be noted that the intensity features are well preserved, while the noise components are significantly reduced. It is also noteworthy that the peak of the filtered data set appears narrower than the peak of the original noisy data signal, which results in the enhancement of the spectral peak's resolution. This is a result of the suppression of the peak shoulders' low intensity values. This artificial behavior of the noise reduced filter, while obviously potentially beneficial in some cases, is still recognized as signal distortion, and has to be separately noted.

Further, it should be noted that the baseline of the noisy data signal is essentially removed by the noise reduction filter, while preserving the main peak intensity. While this behavior may be advantageous in some cases, it is pointed out as a potential signal distortion feature of the noise reduction filter. In general, traditional baseline subtraction methods can be used, prior to using the noise reduction filter, to avoid potential signal distortion in specific applications.

FIG. 8 shows the graphical results obtained when the noise reduction filter was applied to a real-world noisy data signal obtained from an instrument. This example is shown to illustrate basic features of the noise reduction filter by highlighting the step-wise description of the algorithmic steps. Specifically, FIG. 8A is a graph, denoted as y(x), from a real-world experiment involving mass spectroscopy noisy extracted ion chromatogram typically used to estimate an instrument's signal-to-noise ratio (SNR). It should be noted that the noisy data signal used here is intentionally chosen from an instrument which was failing the SNR test. This example illustrates how the noise reduction filter can suppress the noise components of noisy data signals with very low SNRs. The y(x) data is shown in FIG. 8A. FIGS. 8B and 8C are graphs showing the intensity and differential intensity sorted sets, {Z} and {dZ}, respectively.

Figure 8A:
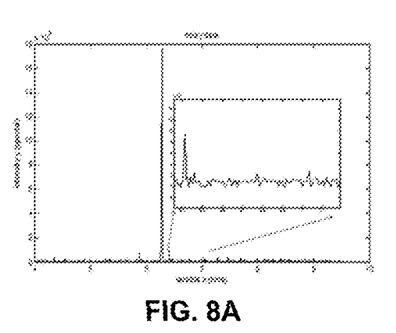
FIGS. 8A-8I are graphs showing signals according to various illustrative embodiments of the disclosure.
Figure 8B:
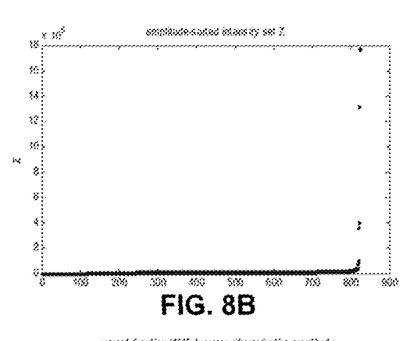
Figure 8C:
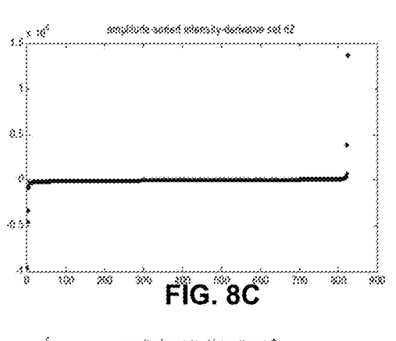
Figure 8D:
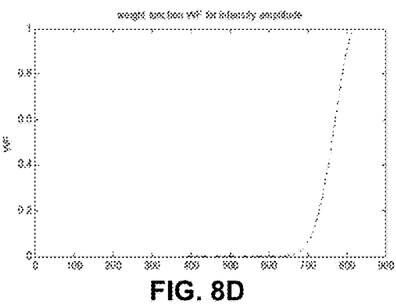
Figure 8E:
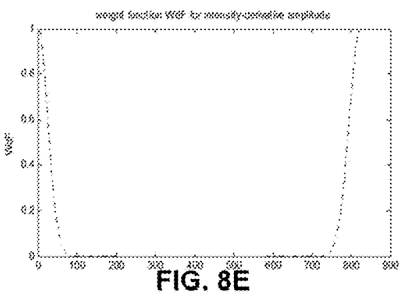
Figure 8F:
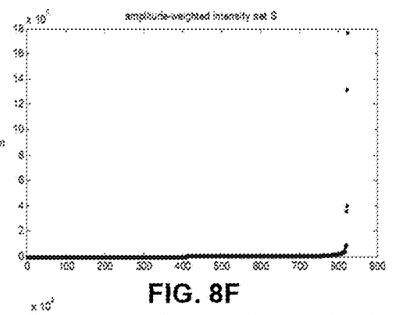
Figure 8G:
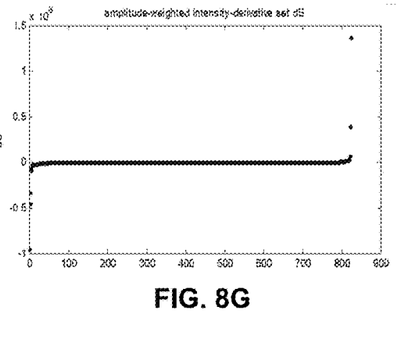

FIGS. 8D and 8E show the weighting functions WF and WdF, using Gaussian curves, applied to the sorted intensity and differential intensity data sets {Z} and {dZ} shown in FIGS. 8B and 8C. After multiplication of {Z} and {dZ} by respective weighting functions WF and WdF, weighted intensity and differential intensity data sets {S} and {dS} are generated as shown in FIGS. 8F and 8G, respectively. In this example the graphs of sets {S} and {dS} are not that different from the graphs of sets {Z} and {dZ}, but importantly, a great deal of spectral power associated with noise is no longer present in {S} and {dS} compared to {Z} and {dZ}.

Figure 8H:
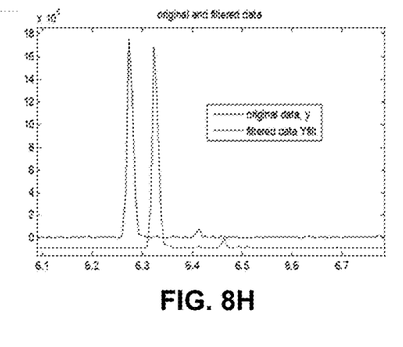
Figure 8I:
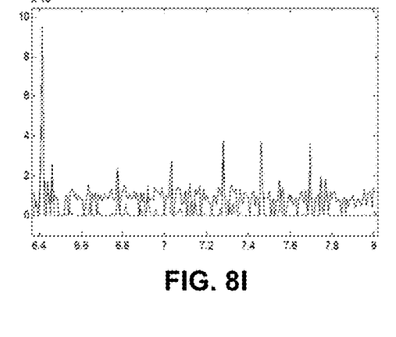

After rearranging the data points in {S} and {dS} and restoring them back to the original order of sets {Y} and {dY}, the intensity data values are added to their corresponding differential intensity values. Next, the first intensity data point of {Y} is added as a first value in the rearranged data set generating the final filtered output data set {Yfiltered}. The filtered output data set {Yfiltered} and the original noisy data signal are shown in FIG. 8H with a small offset to show that strong spectral components are well preserved. In FIG. 8I, the sidebands are magnified to show the low intensity peaks and noise with no offset to show that strong spectral features ("peaks") are well preserved while unwanted noise is substantially removed from the low intensity peaks.

Figure 9A:
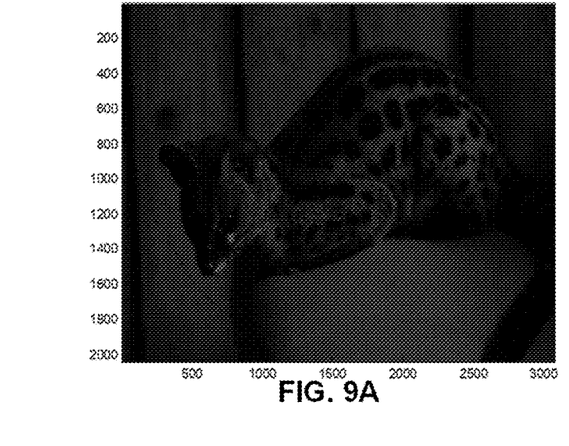
FIGS. 9A and 9B depict the results of a filter applied to a photograph, according to various illustrative embodiments of the disclosure.
Figure 9B:
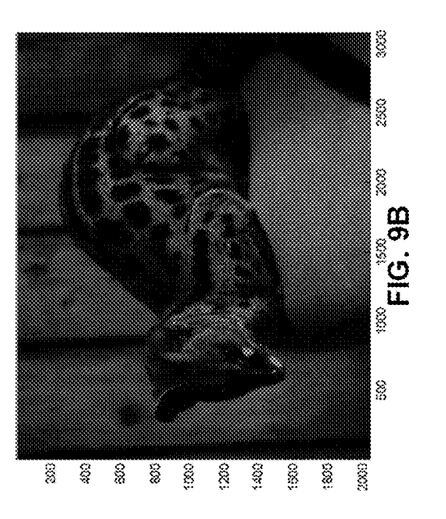

FIG. 9A corresponds to a dark black and white photograph that was taken at night. The dark photo in FIG. 9A was passed as an input to the noise reduction filter to generate a brighter photo with enhancements to the signal-to-noise ratio as shown in FIG. 9B. The noise reduction filter was applied only across the pixel rows of the dark photo in FIG. 9A. It should be noted that this filter can be also be applied simultaneously across pixel rows and columns, or sequentially, and with inclusion of diagonal pixel sets (upper left to lower right, and lower left to upper right) if so desired. This application does not change the principle of the filter method. It also should be noted that additional scaling parameters, K and Kd, for weighting functions WF and WdF, were used in the noise reduction filter for this image processing application. The additional scaling factors amplify regions of high intensity and differential intensity. Moreover, in previous examples above, high intensity data points were considered "informative" and preserved, while low differential intensity data points were suppressed by using low weighting values. Therefore, in each application, it is important to understand what features of intensity and differential intensity contain useful spectral information that need to be preserved.

Figure 9C:
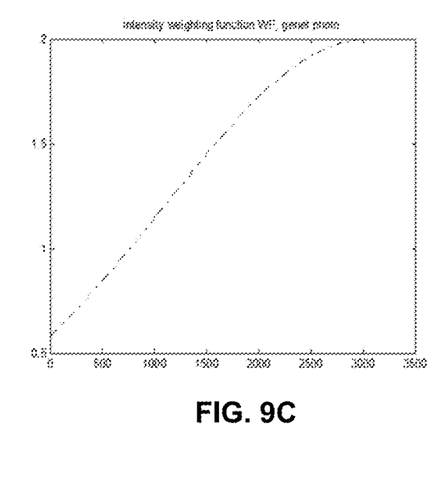
FIGS. 9C-9E are graphs depicting filtering according to various illustrative aspects of the disclosure.
Figure 9D:
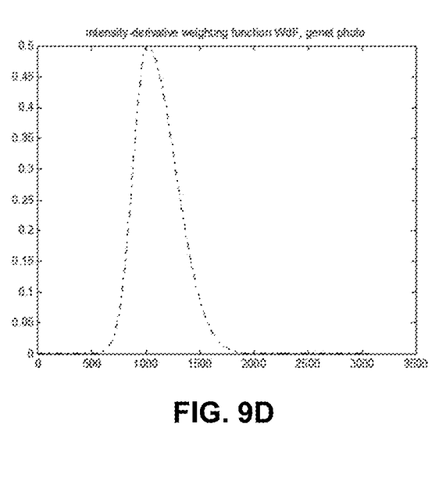

FIGS. 9C and 9D show the weighting functions WF and WdF used in this image processing application. Additional scaling coefficients of 2 (for intensity) and 0.5 (for differential intensity) were used to increase the brightness (intensity multiplied by 2) and reduce the noise in the differential intensity data. Also, the preservation of low differential intensity values and the suppression of high differential intensity values by WdF function reduces granular "pixel" noise—something useful in photography or image processing application but not significant in mass spectra or chromatograms. This illustrates the versatility of the noise reduction filter.

Figure 9E:
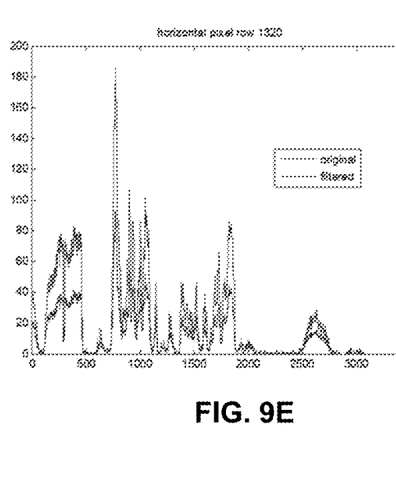

FIG. 9E shows the intensity spectra of pixels in row 1320 of the black and white photos. FIG. 9E depicts the original data set generated from the pixels in row 1320 of the dark photo in FIG. 9A and the filtered output data set generated from the pixels in row 1320 of the brighter and clearer (higher signal-to-noise ratio) photo in FIG. 9B. Therefore, FIG. 9E shows the suppression of noise in the original dark photo to produce an enhanced photo representing a noise filtered output. It should be noted that the weighting functions used to achieve enhancement or suppression of bulk photographic attributes such as brightness, contrast, noise, etc., can be applied to different applications using the noise reduction filter in this disclosure.

Although the subject matter has been described in language specific to structural features and/or methodological acts, it is to be understood that the subject matter defined in the appended claims is not necessarily limited to the specific features or acts described above. Rather, the specific features and acts described above are disclosed as illustrative forms of implementing the claims.

What is claimed is:

1. A method comprising:
   receiving, using a receiver, a data signal comprising a noise component and a signal component;
   generating, based on the received data signal, a first data set comprising ordered pairs of intensity values that indicate intensity of the data signal and differential intensity values that indicate differential intensity of the data signal;
   sorting the first data set at least by sorting the intensity values of the first data set and sorting the differential intensity values of the first data set;
   applying a weighted multiplication function to the sorted first data set;
   rearranging the ordered pairs in the weighted first data set to correspond to the original order of the ordered pairs in the first data set;
   generating a second data set at least by adding the intensity values to their corresponding differential intensity values of the ordered pairs in the rearranged data set; and
   generating an output data set at least by inserting a first intensity value of the first data set into a first position of the second data set.

2. The method of claim 1, wherein the noise component and the signal component have one or more of overlapping intensity characteristics or overlapping frequency spectral characteristics.

3. The method of claim 1, wherein applying the weighted multiplication function comprises applying a Gaussian function, and wherein a peak of the Gaussian function occurs where an intensity value of the sorted first data set is at a maximum value.

4. The method of claim 1, wherein the weighted multiplication function comprises a step function, a hamming function, or a sigmoid function.

5. The method of claim 1, further comprising selecting the weighted multiplication function based on a distribution of intensity values of the sorted first data set.

6. The method of claim 1, wherein applying the weighted multiplication function comprises applying at least two different functions, wherein a first function is applied to the intensity values and a second function is applied to the differential intensity values.

7. The method of claim 1, further comprising changing, based on the ordered pairs in the sorted first data set, a width and an amplitude of the weighted multiplication function.

8. The method of claim 1, further comprising applying scaling factors to the weighted multiplication function to amplify different regions of intensity values and differential intensity values in the sorted first data set.

9. The method of claim 1, wherein an intensity of a signal component of the data signal is larger than an intensity of a noise component of the data signal.

10. The method of claim 1, wherein frequency components of a signal spectrum of the data signal overlap frequency components of a noise spectrum of the data signal.

11. The method of claim 1, wherein the first data set comprises a two dimensional orthogonal set.

12. An apparatus comprising:
one or more processors; and
a non-transitory memory storing computer-executable instructions that, when executed by the one or more processors, cause the apparatus to:
receive, using a receiver, a data signal;
generate, based on the received data signal, a first data set comprising ordered pairs of intensity values that indicate intensity of the data signal and differential intensity values that indicate differential intensity of the data signal;
sort the first data set at least by sorting the intensity values of the first data set and sorting the differential intensity values of the first data set;
apply a weighted multiplication function to the sorted first data set;
rearrange the ordered pairs in the weighted first data set to correspond to the original order of ordered pairs in the first data set;
generate a second data set at least by adding the intensity values to their corresponding differential intensity values of the ordered pairs in the rearranged data set; and
generate an output data set at least by inserting a first intensity value of the first data set into a first position of the second data set.

13. The apparatus of claim 12, wherein a signal-to-noise ratio of the data signal is less than a predetermined threshold.

14. The apparatus of claim 12, wherein a signal-to-noise ratio of the output data set is greater than a predetermined threshold.

15. The apparatus of claim 12, wherein a signal-to-noise ratio of the output data set is greater than a signal-to-noise ratio of the data signal.

16. The apparatus of claim 12, wherein the computer instructions are configured to cause the apparatus to apply the weighted multiplication function by applying a first function applied to the intensity values and a second function to the differential intensity values.

17. The apparatus of claim 12, wherein the computer instructions are configured to adjust, based on a distribution of the sorted first data set, the weighted multiplication function.

18. The apparatus of claim 12, wherein the computer instructions further cause the apparatus to apply scaling factors to the weighted multiplication function to amplify different regions of intensity values and differential intensity values in the sorted first data set.

19. An apparatus comprising:
a receiver configured to electronically couple to a data source and receive an input data signal from the data source;
a sampler configured to sample the input data from the data source;
one or more processors electronically coupled to the sampler; and
a non-transitory memory storing computer instructions that, when executed by the one or more processors, cause the apparatus to:
receive, using the receiver, the sampled input data from the data source;
generate, based on the sampled data, a first data set comprising ordered pairs of intensity values that indicate intensity of the data signal and differential intensity values that indicate differential intensity of the data signal;
sort the first data set at least by sorting the intensity values of the first data set and sorting the differential intensity values of the first data set;
apply a weighted multiplication function to the sorted first data set;
rearrange the ordered pairs in the weighted first data set to correspond to the original order of ordered pairs in the first data set;
generate a second data set at least by adding the intensity values to their corresponding differential intensity values of the ordered pairs in the rearranged data set; and
generate an output data set at least by inserting a first intensity value of the first data set into a first position of the second data set.

20. The apparatus of claim 19, wherein the data source comprises a spectrograph.

* * * * *